United States Patent [19]
Lee

[11] Patent Number: 6,001,216
[45] Date of Patent: Dec. 14, 1999

[54] APPARATUS AND METHODS FOR RERECIRCULATING ETCHING SOLUTION DURING SEMICONDUCTOR WAFER PROCESSING

[75] Inventor: Seung-kun Lee, Kyungki-do, Rep. of Korea

[73] Assignee: Samsung Electronics Co., Ltd., Rep. of Korea

[21] Appl. No.: 09/047,914

[22] Filed: Mar. 25, 1998

[30] Foreign Application Priority Data

Jun. 25, 1997 [KR] Rep. of Korea ................ 97 27094

[51] Int. Cl.[6] ........................................... C23F 1/02
[52] U.S. Cl. ........................ 156/345; 216/93; 438/745; 438/753; 134/10; 134/43; 134/47
[58] Field of Search ........................ 156/345; 216/83, 216/93; 438/745, 753; 134/10, 43, 47

[56] References Cited

U.S. PATENT DOCUMENTS

| | | | |
|---|---|---|---|
| 4,980,017 | 12/1990 | Kaji et al. | 156/642 |
| 5,470,421 | 11/1995 | Nakada et al. | 156/642.1 |
| 5,904,572 | 5/1999 | Lee et al. | 438/745 |

*Primary Examiner*—Yogendra Gupta
*Attorney, Agent, or Firm*—Myers Bigel Sibley & Sajovec, P.A.

[57] ABSTRACT

Semiconductor wafer processing methods and apparatus recirculates etching solution from a lowermost point of a container hosting wafers through a filtration device and back to a point above the location of the wafers within the container. The container includes an inclined bottom wall and an outlet located below an uppermost portion of the inclined bottom wall.

23 Claims, 4 Drawing Sheets

APPARATUS AND METHODS FOR RERECIRCULATING ETCHING SOLUTION DURING SEMICONDUCTOR WAFER PROCESSING

FIELD OF THE INVENTION

The present invention relates generally to microelectronic device processing and, more particularly, to microelectronic substrate etching.

BACKGROUND OF THE INVENTION

During processing of microelectronic substrates, such as semiconductor wafers, selective stripping or etching away of a layer or portions of a layer or layers of the wafers may be required. A conventional technique, referred to as "wet etching" includes immersing a plurality of wafers into an etching solution and moving the wafers in various directions to enhance the etching process.

Accurate removal of material may depend on the processing time, the temperature of the etching solution and the composition of the etching solution. The temperature of the etching solution may be maintained at room temperature. The temperature of the etching solution may also be increased to improve the etching rate and to increase etching efficiency. Etching rate and efficiency may also be influenced by the cleanliness of the etching solution. In order to maintain clean etching solution, the etching solution may be recirculated and filtered using a pump and a filter.

FIG. 1 illustrates an embodiment of a conventional wet etching apparatus for processing semiconductor wafers. The wet etching apparatus includes: an inner container 11 configured to receive semiconductor wafers 25; an outer container 12 connected to the upper peripheral portion of the inner container 11; and a recirculation line 13 in fluid communication with both the inner and outer containers. The etching solution is recirculated in the direction indicated by the arrow 19. Specifically, etching solution overflows from the inner container 11 to the outer container 12, down through the recirculation line 13 and filter 15, and is pumped back into the inner container via a pump 14. Discharge lines 17 may be connected to respective discharge valves 16, as illustrated, so that used etching solution, particles and other contamination generated during the etching processing can be discarded from the recirculation line 13. Accordingly, the inner container 11 may be provided with etching solution free of contaminants, particles and the like.

Unfortunately, various by-products of the etching process, such as photoresist particles, may subside on the bottom of the inner container 11. During recirculation of the etching solution, these particles may be forced up through the wafers, potentially contaminating the wafers. Because contamination may decrease production yields of the semiconductor wafers, there is a demand for a wet etching apparatus that can reduce recontamination of the wafers inside the wet etching apparatus during the etching process.

SUMMARY OF THE INVENTION

It is therefore an object of the present invention to facilitate the recirculation of etching solution during semiconductor wafer processing such that wafer contamination can be reduced.

This and other objects of the present invention are provided by a semiconductor wafer processing apparatus wherein etching solution recirculation flows from a lowermost point of a container hosting wafers through a filtration device and back to a point above the location of the wafers within the container. According to one aspect of the present invention, a first container, having a bottom wall, is configured to receive an open top portion of a second container hosting a plurality of wafers through the bottom wall such that the first and second containers are in fluid communication. The open top portion of the second container defines a substantially vertical axial direction. The second container also includes an inclined bottom wall and an outlet located below an uppermost portion of the inclined bottom wall. The second container bottom wall is inclined between 95° and 105° with respect to the vertical axial direction. The inclination of the second container bottom wall may be adjustable. The second container bottom wall may have a conical shape with a downwardly converging lower portion.

A recirculation system is connected to the second container outlet and pumps etching solution from the outlet to the first container. One or more filters are provided within the recirculation system for removing particles and other impurities in the etching solution. The recirculation system supplies etching solution into the first container along the bottom wall in a direction substantially normal to the vertical axial direction. A discharge line may be provided for removing contaminants and etching solution from the recirculation system.

According to another aspect of the present invention, a container configured to host a plurality of semiconductor wafers therein includes a top portion defining a substantially vertical axial direction, an inclined bottom wall, a side wall extending between the top portion and the inclined bottom portion, and an outlet located below an uppermost portion of the inclined bottom wall. The side wall has a plurality of circumferentially spaced-apart apertures formed therethrough. An annular supply tube extends around the container side wall and is in fluid communication with the container via the apertures. A recirculation system is connected to the outlet and to the annular supply tube.

According to another aspect of the present invention, an inclined supply line extends downwardly between the annular tube and the container side wall. The angle of the inclined supply line may be adjustable and preferably is between 75° and 85° with respect to the vertical axial direction.

According to another aspect of the present invention additional annular supply tubes surround the container. The annular supply tubes are in fluid communication with each other via a connecting tube. The connecting tube facilitates making the distribution of etching solution to the annular supply tubes uniform. Each annular supply tube is in fluid communication with a respective set of apertures formed through the side wall of the container via a respective inclined supply line. The inclined supply lines have an angle (β) of between 5° and 15° with respect to horizontal (between 75° and 85° from the vertical axial direction of the container).

According to another aspect of the present invention, operations for recirculating etching solution according to the present invention, include: withdrawing etching solution from an outlet of the container hosting the semiconductor wafers; filtering contaminants from the withdrawn etching solution to provide clean etching solution; supplying clean etching solution into the container above the wafers; and discharging contaminants from the withdrawn etching solution to a waste container. Etching solution is withdrawn from a location below an uppermost portion of the bottom wall of a container hosting the wafers. The etching solution is recirculated into the container hosting the wafers so that a vortex is avoided. Because the flow of the etching solution is reversed from conventional etching devices, particles separated from the wafers are not easily reattached to the wafers during circulation of the etching solution. Accordingly, the potential for recontamination of the wafers can be reduced and particles within the etching solution can be discharged from the etching apparatus.

BRIEF DESCRIPTION OF THE DRAWINGS

The accompanying drawings, which are incorporated in and constitute a part of the specification, illustrate an embodiment of the invention and, together with the description, serve to explain the principles of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
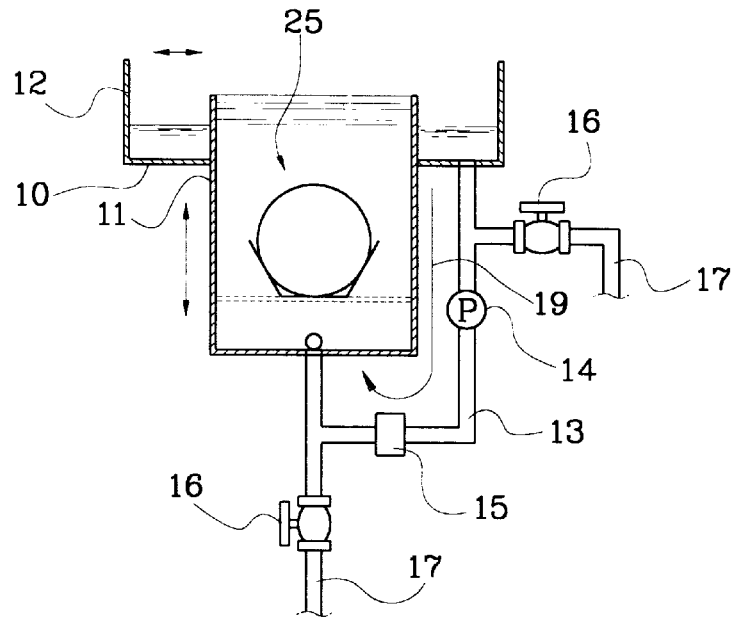
FIG. 1 schematically illustrates a conventional wet etching apparatus for processing semiconductor wafers.
Figure 2:
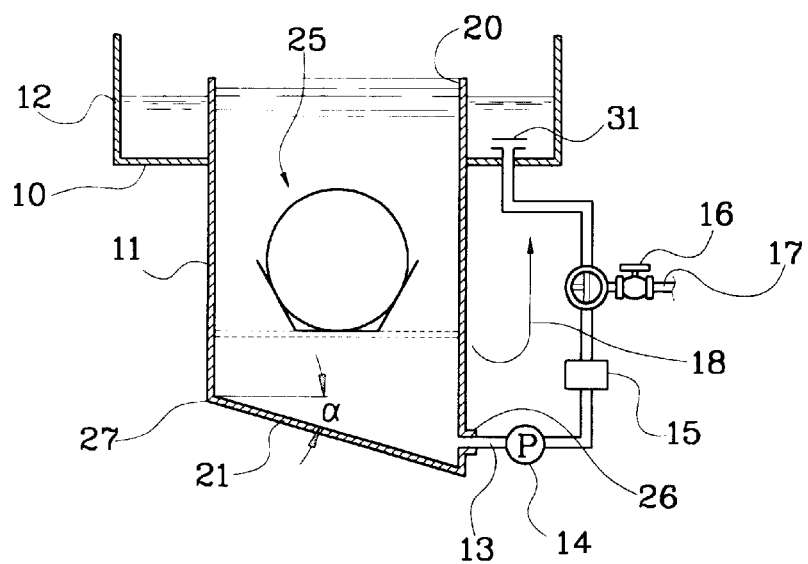
FIG. 2 schematically illustrates a wet etching apparatus having an inclined bottom wall.

Referring now to FIG. 2, a wet etching apparatus for processing semiconductor devices according to one embodiment of the present invention is schematically illustrated. A first or outer container 12 has a bottom wall 10 as illustrated. A second or inner container 11 is configured to receive semiconductor wafers 25 therein for processing. The inner container 11 has an open top 20, an inclined bottom wall 21 and an outlet 26 located below an uppermost portion 27 of the inclined bottom wall. The top portion 20 extends through the outer container bottom wall 10, as illustrated, and is in fluid communication with the outer container 12 such that etching solution can flow from the outer container into the inner container 11. The inner container 11 defines a substantially vertical axial direction out through the top portion 20 thereof.

A recirculation line 13 serves as means for recirculating etching solution from the outlet 26 to the outer container 12 in the direction indicated by arrow 18. The recirculation line 13 includes a pump 14 and a filter 15 downstream from the pump. The etching solution inside the inner container 11 is drained through the recirculation line 13 by operation of the pump 14 and supplied to the inner container 11. The filter 15 serves as means for removing contaminants and other by-products resulting from the etching process from the etching solution. The filter 15 filters the etching solution circulated through the recirculation line 13 and cleans the etching solution by filtering/removing the particles contained in the etching solution, thereby reducing the potential for contamination of the wafers. The pump 14 and the filter 15 are all well-known to those skilled in the related arts and are widely available.

The end 31 of the recirculation line 13 connected to the outer container 12 supplies etching solution into the outer container along the inside surface of the bottom wall 10, and in a direction substantially normal to the vertical axial direction. In the illustrated embodiment, the end 31 of the recirculation line 13 has a T-shape configuration. This configuration helps reduce the likelihood of a vortex stream being produced in the outer container 12 which might also form a vortex in the inner container 11. The end 31 of the recirculation line 13 can have a variety of configurations that allow etching solution to be dispensed into the outer container substantially parallel to the inner surface of the bottom wall 10.

In addition, a discharge line 17 is provided for facilitating the removal of contaminants and etching solution from the recirculation line 13 to a waste container (not shown). The etching solution circulated through the recirculation line 13 is completely drained out of the etching apparatus through the discharge valve 16 and the discharge line 17 connected to the recirculation line. The particles falling down to the lower portion of the inner container by gravity are removed with some of the etching solution.

Preferably, the bottom wall 21 of the inner container 11 is inclined at an angle ($\alpha$), preferably between 5° and 15° with respect to horizontal (between 95° and 105° from the vertical axial direction of the inner container 11). Accordingly, particles generated as by-products during the etching process accumulate at the lower portion of the bottom wall 21 of the inner container 11 via gravity, and are drained from the inner container 11 through the recirculation line 13 connected to the outlet 26. If the angle of the inclined bottom wall is less than 5°, large particles may not be able to move toward the outlet 26 fast enough. By contrast, if the angle of the inclined bottom wall 21 is greater than 15°, the volume of the processing chamber within the inner container 11 may be too big. Preferably, the angle ($\alpha$) of the inclined bottom wall can be varied depending on the diameter of the wafers to be processed.

Figure 3:
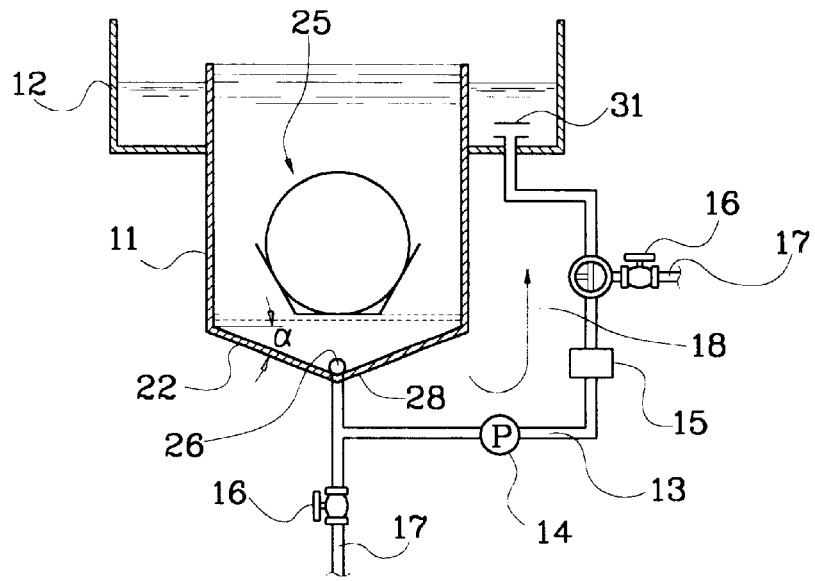
FIG. 3 schematically illustrates a wet etching apparatus having a bottom wall having a conical shape with a downwardly converging lower portion.

The bottom wall 21 of the inner container 11 may have various other configurations such that an inclined bottom wall has an angle ($\alpha$) of between 5° and 15° with respect to horizontal. One such alternative configuration is illustrated in FIG. 3. The bottom wall 22 has a generally conical shape with a downwardly converging lower portion 28. An outlet 26 is located at the downwardly converging lower portion 28 as illustrated. Each downwardly converging portion of the bottom wall 22 preferably has an angle ($\alpha$) of between 5° and 15° with respect to horizontal (between 95° and 105° from the vertical axial direction of the inner container 11).

Figure 4:
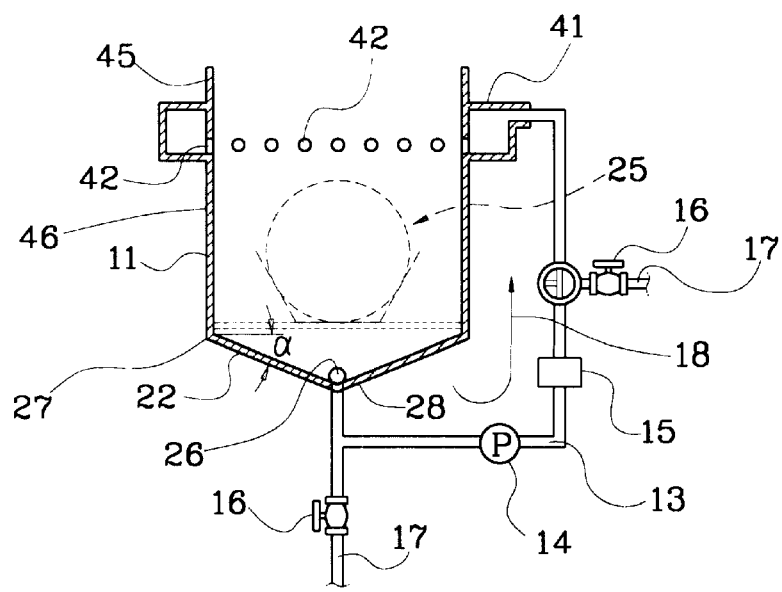
FIG. 4 schematically illustrates a wet etching apparatus having an annular supply tube extending around and in fluid communication with the container via a plurality of apertures.

Referring now to FIG. 4, a wet etching apparatus for processing semiconductor devices according to another embodiment of the present invention is schematically illustrated. A processing container 11 has a similar configuration to the container 11 illustrated in FIG. 3 and is configured to receive semiconductor wafers therein for processing. The container 11 includes a top portion 45, an inclined bottom wall 22, and a side wall 46 extending between the top portion and the inclined bottom wall. An outlet 26 is located below an uppermost portion 27 of the inclined bottom wall 22 as illustrated. The container 11 has a substantially vertical axial direction.

The container side wall 46 has a plurality of circumferentially spaced-apart apertures 42 formed therethrough. An annular supply tube 41 extends around the outside of the container 11 adjacent the side wall 46 and in fluid communication with the container via the apertures 42. A recirculation line 13 serves as means for providing etching solution from an outlet 26 in the lowermost portion 28 of the bottom wall 22 into the annular supply tube 41, as illustrated.

A pump 14 is installed in the recirculation line 13 in order to circulate the etching solution from the lowermost portion 28 of the container 11 into the annular supply tube 41. As described above with respect to FIG. 3, the bottom wall 22 has a generally conical shape with a downwardly converging lower portion 28. Each downwardly converging portion of the bottom wall preferably has an angle (α) of between 5° and 15° with respect to horizontal (between 95° and 105° from the vertical axial direction of the inner container 11).

The etching solution flowing through the pump 14 is supplied through the recirculation line 13 into the annular supply tube 41. Etching solution supplied in the annular supply tube 41 is radially supplied into the center of the container 11 through the apertures 42 in a uniform manner.

Figure 5:
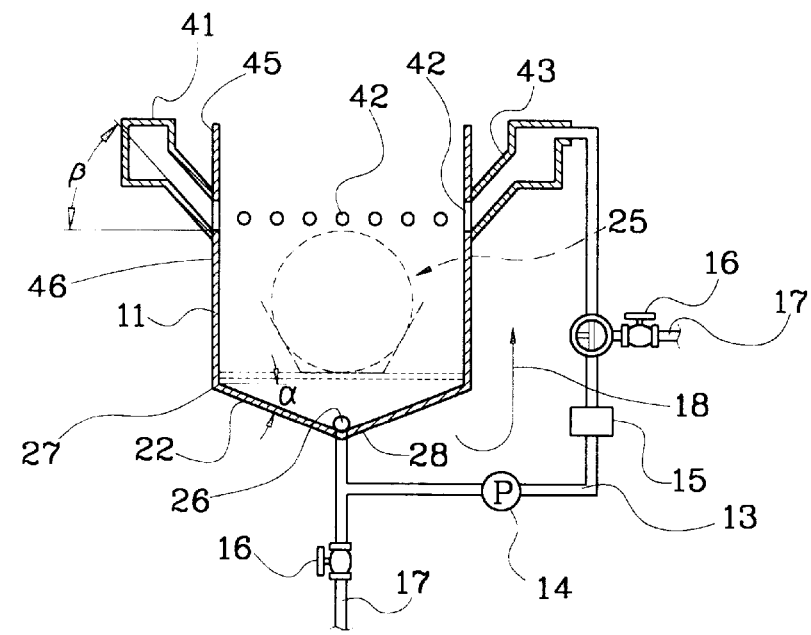
FIG. 5 schematically illustrates a wet etching apparatus having an annular supply tube in fluid communication with the container via an inclined portion.

Referring now to FIG. 5, another embodiment of the container 11 and annular supply tube 41 of FIG. 4 is illustrated. The annular supply tube 41 is connected to the upper peripheral surface of the container 11 via an inclined supply line 43. The inclined supply line 43 allows the etching solution to flow into the container 11 from the annular supply tube 41 via gravity. Preferably, the inclined supply line 43 has an angle (β) of between 5° and 15° with respect to horizontal (between 75° and 85° from the vertical axial direction of the container 11). The inclined angle (β) may vary and is not limited to the above range. Furthermore, the inclined angle (β) can be adjusted so that a vortex stream is not generated inside the inner container 11 when etching solution is provided thereto.

Figure 6:
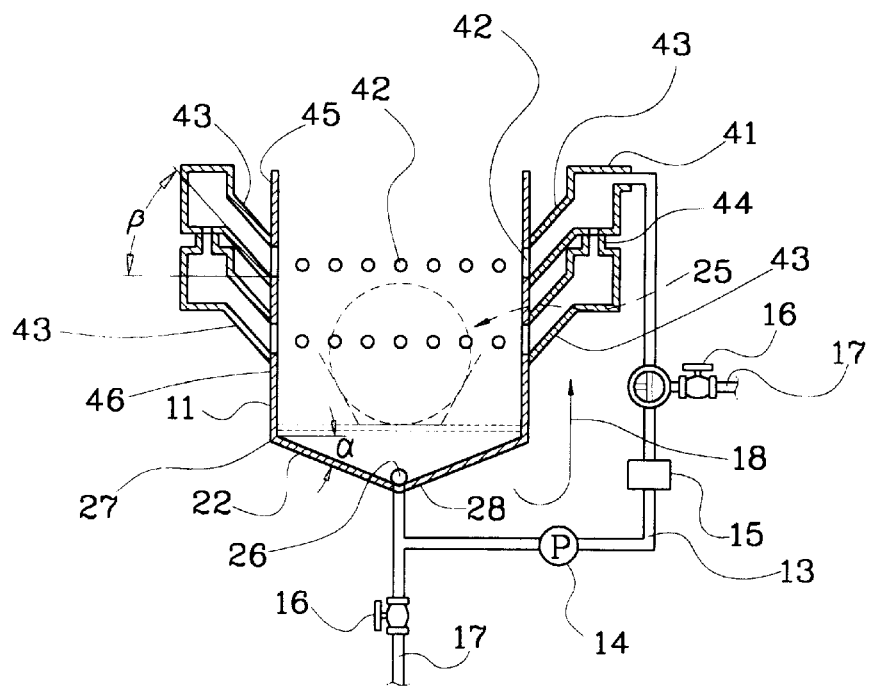
FIG. 6 schematically illustrates a wet etching apparatus having two annular supply tubes in fluid communication with the container via two respective inclined portions.

Referring now to FIG. 6, additional annular supply tubes 41 can be installed on the upper peripheral surface of the container 11. The annular supply tubes 41 preferably are connected so as to be in fluid communication with each other via a connecting tube 44. The connecting tube 44 facilitates uniform distribution of etching solution to the annular supply tubes 41. In the illustrated embodiment, each annular supply tube 41 is in fluid communication with a set of apertures 42 formed through the side wall 46 of the container 11 via a respective inclined supply line 43. As described above, the inclined supply lines 43 have an angle (β) of between 5° and 15° with respect to horizontal (between 75° and 85° from the vertical axial direction of the container 11).

Figure 7:
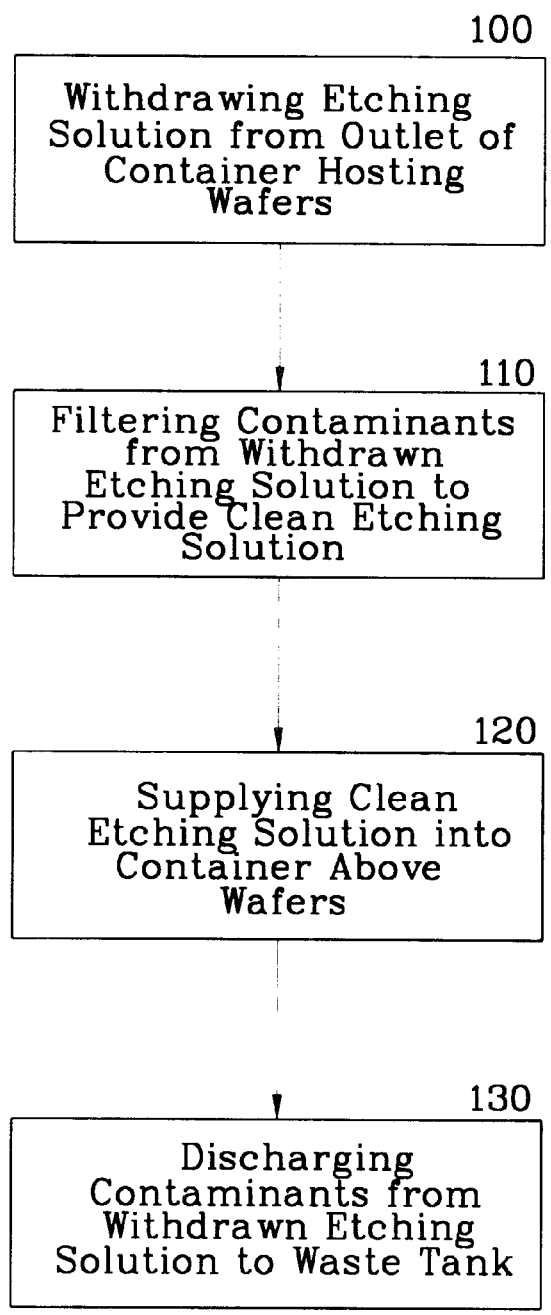
FIG. 7 schematically illustrates operations for recirculating etching solution within an apparatus for etching semiconductor wafers according to the present invention.

Referring now to FIG. 7, operations for recirculating etching solution according to the present invention, include: withdrawing etching solution from an outlet of the container hosting the semiconductor wafers (Block 100); filtering contaminants from the withdrawn etching solution to provide clean etching solution (Block 110); supplying clean etching solution into the container above the wafers (Block 120); and discharging contaminants from the withdrawn etching solution to a waste container (Block 130). As described above, etching solution is preferably withdrawn from a location below an uppermost portion of the bottom wall of a container hosting the wafers. Also, it is preferable that etching solution be supplied back into the container hosting the wafers so that a vortex is avoided. Because the flow of the etching solution is reversed from conventional etching devices, particles separated from the wafers are not easily reattached to the wafers during circulation of the etching solution. Accordingly, recontamination of the wafers may be avoided and particles within the etching solution can be immediately discharged from the etching apparatus.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A microelectronic substrate etching apparatus, comprising:
   a first container comprising a bottom wall;
   a second container configured to receive microelectronic substrates therein for processing, said second container comprising an open top portion defining a substantially vertical axial direction, an inclined bottom wall and an outlet located below an uppermost portion of said inclined bottom wall;
   wherein said top portion extends through said first container bottom wall and is in fluid communication with said first container; and
   means for recirculating etching solution from said outlet to said first container.

2. An apparatus according to claim 1 wherein said second container bottom wall is inclined between 95° and 105° with respect to said vertical axial direction.

3. An apparatus according to claim 2 wherein the inclination of said second container bottom wall is adjustable.

4. An apparatus according to claim 1 wherein said second container bottom wall comprises a conical shape with a downwardly converging lower portion.

5. An apparatus according to claim 1 wherein said recirculating means comprises means for filtering contaminants out of said etching solution.

6. An apparatus according to claim 1 wherein said recirculating means comprises means for supplying etching solution into said first container along said bottom wall in a direction substantially normal to said vertical axial direction.

7. An apparatus according to claim 1 further comprising means for discharging contaminants and etching solution from said recirculating means.

8. A microelectronic substrate etching apparatus, comprising:
   a container configured to receive microelectronic substrates therein for processing, said container comprising a top portion defining a substantially vertical axial direction, an inclined bottom wall, a side wall extending between said top portion and said inclined bottom portion, and an outlet located below an uppermost portion of said inclined bottom wall;

wherein said side wall includes a plurality of circumferentially spaced-apart apertures formed therethrough;

an annular supply tube extending around said container side wall and in fluid communication with said container via said apertures; and means for recirculating etching solution from said outlet to said annular supply tube.

9. An apparatus according to claim 8 wherein said container bottom wall is inclined between 95° and 105° with respect to said vertical axial direction.

10. An apparatus according to claim 8 wherein said second container bottom wall comprises a conical shape with a downwardly converging lower portion.

11. An apparatus according to claim 8 wherein said recirculating means comprises means for filtering contaminants out of said etching solution.

12. An apparatus according to claim 11 wherein said recirculating means further comprises a pump located upstream of said filtering means.

13. An apparatus according to claim 8 further comprising means for discharging contaminants and etching solution from said recirculating means.

14. An apparatus according to claim 8 further comprising an inclined supply line extending downwardly between said annular tube and said container side wall.

15. An apparatus according to claim 14 wherein said inclined supply line is inclined between 75° and 85° with respect to said vertical axial direction.

16. An apparatus according to claim 14 wherein the inclination of said inclined supply line is adjustable.

17. A microelectronic substrate etching apparatus, comprising:

a container configured to receive microelectronic substrates therein for processing, said container comprising a top portion defining a substantially vertical axial direction, an inclined bottom wall, a side wall extending between said top portion and said inclined bottom portion, and an outlet located below an uppermost portion of said inclined bottom wall;

a first annular supply tube extending around said container side wall and in fluid communication with said container via a first plurality of apertures formed therethrough;

a second annular supply tube located below said first annular supply tube and extending around said container side wall, said second annular supply tube in fluid communication with said container via a second plurality of apertures formed therethrough;

wherein said first and second annular supply tubes are in fluid communication; and means for recirculating etching solution from said outlet to said first annular supply tube.

18. An apparatus according to claim 17 wherein said container bottom wall is inclined between 95° and 105° with respect to said vertical axial direction.

19. An apparatus according to claim 17 further comprising a first inclined supply line extending downwardly between said first annular supply tube and said container side wall and a second inclined supply line extending downwardly between said second annular supply tube and said container side wall.

20. An apparatus according to claim 17 wherein said first and second inclined supply lines are inclined between 75° and 85° with respect to said vertical axial direction.

21. A method of recirculating etching solution through an apparatus for etching microelectronic substrates, wherein the apparatus comprises the substrate etching apparatus of claim 1 said method comprising the steps of:

(a) withdrawing etching solution from the apparatus outlet;

(b) filtering contaminants from the withdrawn etching solution to provide clean etching solution; and (c) supplying clean etching solution into the apparatus above the microelectronic substrates contained therein.

22. A method according to claim 21 wherein said step (c) comprises supplying etching solution into the apparatus in a direction substantially normal to a vertical direction.

23. A method according to claim 21 further comprising the step of discharging contaminants from the withdrawn etching solution to a waste container.

* * * * *

UNITED STATES PATENT AND TRADEMARK OFFICE
CERTIFICATE OF CORRECTION

PATENT NO.    : 6,001,216
DATED         : December 14, 1999
INVENTOR(S)   : Seung-kun Lee It is certified that error appears in the above-identified patent and that said Letters Patent is hereby corrected as shown below:

On the Cover Page,

Please correct the invention title to read "Apparatus and Methods for Recirculating Etching Solution During Semiconductor Wafer Processing".

Column 1, line 2, please delete "RERECIRCULATING" and insert - - RECIRCULATING - -.

Signed and Sealed this

Tenth Day of April, 2001

*Attest:*

NICHOLAS P. GODICI

*Attesting Officer*   *Acting Director of the United States Patent and Trademark Office*